United States Patent [19]

Hayashi et al.

[11] Patent Number: 5,672,518
[45] Date of Patent: Sep. 30, 1997

[54] METHOD OF FABRICATING SEMICONDUCTOR DEVICE HAVING STACKED LAYERED SUBSTRATE

[75] Inventors: Yutaka Hayashi, Tsukuba; Masaaki Kamiya, Tokyo; Yoshikazu Kojima, Tokyo; Hiroaki Takasu, Tokyo, all of Japan

[73] Assignees: Agency of Industrial Science and Technology; Seiko Instruments Inc., both of Japan

[21] Appl. No.: 60,163

[22] Filed: May 7, 1993

Related U.S. Application Data

[62] Division of Ser. No. 771,756, Oct. 4, 1991, Pat. No. 5,233,211.

[30] Foreign Application Priority Data

Oct. 16, 1990 [JP] Japan .................. 2-277436

[51] Int. Cl.⁶ .................. H01L 21/265; H01L 31/18
[52] U.S. Cl. .................. 437/2; 437/21; 437/41; 437/62; 437/974; 148/DIG. 12
[58] Field of Search .................. 437/2, 41, 101, 437/909, 974, 21, 62; 148/DIG. 12

[56] References Cited

U.S. PATENT DOCUMENTS

| | | | |
|---|---|---|---|
| 4,609,930 | 9/1986 | Yamazaki | 357/23.7 |
| 4,748,485 | 5/1988 | Vasudev | 357/23.7 |
| 4,751,196 | 6/1988 | Pennell et al. | 437/84 |
| 4,871,234 | 10/1989 | Suzuki | 350/333 |
| 4,875,086 | 10/1989 | Malhi et al. | 357/54 |
| 5,071,785 | 12/1991 | Nakazato et al. | 437/62 |
| 5,108,843 | 4/1992 | Ohtaka et al. | 428/466 |

FOREIGN PATENT DOCUMENTS

| | | | |
|---|---|---|---|
| 0136509 | 4/1985 | European Pat. Off. . | |
| 58-218169 | 12/1983 | Japan . | |
| 1226167A | 9/1989 | Japan | 437/974 |
| 2154232A | 6/1990 | Japan . | |

OTHER PUBLICATIONS

Electronics Letters, vol.25, No.15, 20 Jul. 1989, pp.1009–1011, R.P. Zingg et al., "High-Quality Dual-Gate PMOS Devices In Local Overgrowth (LOG)".

*Primary Examiner*—John Niebling
*Assistant Examiner*—Richard A. Booth
*Attorney, Agent, or Firm*—Adams & Wilks

[57] ABSTRACT

The invention provides a semi-conductor light valve device and a process for fabricating the same. The device comprises a composite substrate having a supporte substrate, a light-shielding thin film formed on said supporte substrate and semiconductive thin film disposed on the light-shielding thin film with interposing an insulating thin film. A switching element made of a transistor and a transparent electrode for driving light valve are formed on the semiconductive thin film, and the switching element and the transparent electrode are connected electrically with each other. The transistor includes a channel region in the semiconductive thin film and a main gate electrode for controlling the conduction in the channel region, and the light-shielding thin film layer is so formed as to cover the channel region on the side opposite to said channel region, so as to prevent effectively a back channel and shut off the incident light.

10 Claims, 6 Drawing Sheets

METHOD OF FABRICATING SEMICONDUCTOR DEVICE HAVING STACKED LAYERED SUBSTRATE

This is a division of application Ser. No. 771,756 filed Oct. 4, 1991 now U.S. Pat. No. 5,233,211.

BACKGROUND OF THE INVENTION

1. Field of the Invention

The present invention relates to light valve devices of a flat plate type, such as active matrix liquid crystal panels used for display apparatus of a direct viewing type or display apparatus of a projection type. More specifically, the invention relates to a method of fabricating a semiconductor device that is incorporated as a substrate of the liquid crystal panel and that has electrodes and switching elements to directly drive the liquid crystal.

2. Description of the Related Background Art

The active matrix device is based on a simple principle in which each pixel is equipped with a switching element and when a particular pixel is to be selected, the corresponding switching element is made conductive and when it is not selected, the switching element is made nonconductive. The switching elements are formed on a glass substrate which forms part of the liquid crystal panel. Therefore, the technology for thinning and miniaturizing the switching elements is very important. Thin-film transistors are ordinarily used as such switching elements.

In an active matrix device, so far, thin-film transistors have been formed on the surface of a thin silicon film that is deposited on the glass substrate. Such transistors are generally of a field effect insulated gate type. A transistor of this type is constituted by a channel region formed in the thin silicon film and a gate electrode which is formed so as to cover the channel region. A predetermined voltage is applied to the gate electrode to control the conductance of the channel region and to carry out the switching operation.

The conventional insulated gate-type thin film transistors have a problem in that a leakage current flows into the channel region through the back side of the thin film even when the channel region is made nonconductive by controlling the gate voltage. That is, so-called back channel takes place impairing the proper operation of the active matrix device. Namely, in order to operate the pixels at high speeds by a line sequence system, the conductance ratio of the switching elements between the conductive state and the nonconductive state must be greater than $10^6$. In fact, however, the back channel makes it difficult to obtain the required switching performance.

Even if the back channel were extinguished, the channel region of the thin-film transistor exhibits an increased conductance if light from an external source falls thereon since the semiconductor device is used under the illuminated condition, causing leakage current in the drain and source in the nonconductive state. Further, the ratio of this leakage current to the leakage current when the semiconductor device is not illuminated increases with increase in the quality of the semiconductor thin film such as single crystal that forms the channel regions, causing another problem.

In view of the above-mentioned conventional problems, the object of the present invention is to provide a method of fabricating a semiconductor device for driving light valves of a flat plate type having thin film transistors of a structure which is capable of effectively preventing the back channel and shutting off the incident light.

SUMMARY OF THE INVENTION

In order to accomplish the above objective a semiconductor device according to the present invention is formed by using a substrate having a stacked structure which includes an insulating support substrate made of a light-transmitting material, a light-shielding thin film provided on the support substrate, and a semiconductor thin film provided on the light-shielding thin film via an insulating film. Transparent electrodes for driving light valves, i.e., pixel electrodes, are arranged on the support substrate. Furthermore, switching elements are formed to selectively excite the pixel electrodes. Each of the switching elements consists of a field effect insulated gate type transistor having a channel region and a main gate electrode for controlling the conductivity of the channel region. The channel region is formed in the semiconductor thin film, and the main gate electrode is so formed as to cover the channel region. A light-shielding layer is formed separately from the main gate electrode. The light-shielding layer is constituted by a light-shielding thin film and is provided on the side opposite to the main gate electrode with respect to the channel region. That is, the channel region of the transistor is sandwiched between the main gate electrode and the light-shielding layer vertically.

Preferably, both the main gate electrodes disposed on the transistor channel region and sub-gate electrodes under the transistor channel region are made of a light-shielding material and together with the light-shielding layer nearly completely shuts off light entering the channel region from the outside.

More preferably, the light-shielding layer is made of an electrically conductive material to eliminate the back channel. It is further possible to supply electric current to the light-shielding layer in order to control the back channel.

Further, the channel region of the transistor is preferably formed in a semiconducting thin film of single silicon crystal and can be processed on the order of sub-microns using an ordinary LSI technology.

According to the present invention, the conductance in the channel region of each transistor constituting a switching element is controlled by a couple of main gate and sub-gate electrodes on both surfaces of the semiconducting thin film via insulating films. Therefore, there develops no back channel unlike the structure controlled by one gate electrode on one surface thereof only as in a conventional thin film transistor. In other words, the sub-gate electrodes according to the present invention are provided in order to suppress the back channel.

In addition, since the channel region is covered by a couple of light-shielding gate electrodes from the upper and lower sides, light incident on the light valve device passes through the pixel electrode but is nearly completely shut off in the channel region, making it possible to effectively prevent the generation of photoelectric current.

DESCRIPTION OF THE PREFERRED EMBODIMENTS

Figure 1:
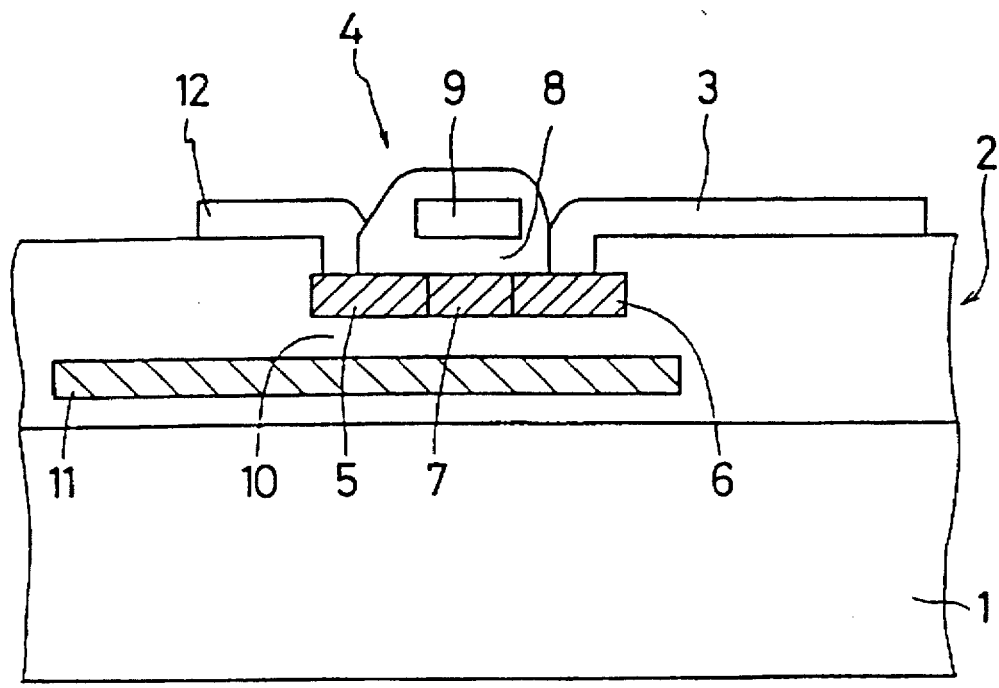
FIG. 1 is a partial sectional view which schematically illustrates the structure of a flat-type semiconductor device for driving light valves.

A preferred embodiment of the present invention will now be described in detail with reference to the drawings. FIG. 1 is a schematic partial sectional view of a semiconductor device for driving light valves of a flat plate type. The device is of a laminated layer structure 2 formed on a support substrate 1. The laminated layer structure 2 includes a light-shielding thin film and a semiconducting thin film formed on the light-shielding thin film via an insulating film. A transparent electrode for driving a respective light valve, i.e., pixel electrode 3 is formed on the surface of a composite substrate which is of a stacked-layer structure 2. Further, in the stacked-layer structure 2 is correspondingly formed a switching element 4 to selectively excite the pixel electrode 3. The switching element 4 has a drain region 5 and a source region 6 that are formed in a semiconducting thin film and are spaced apart from each other. The drain region 5 is connected to a signal line 12 and the source region 6 is connected to the corresponding pixel electrode 3. Moreover, a channel region 7 is provided between the drain region 5 and the source region 6. A main gate electrode 9 is formed on the front surface side of the channel region 7 via a gate insulating film 8. The main gate electrode 9 is connected to a scanning line that is not shown and controls the conductance of the channel region 7 in order to turn the switching element 4 on or off. A light-shielding layer 11 is arranged on the back surface side of the channel region 7 via an insulating layer 10. That is, the light-shielding layer 11 is arranged on the side opposite to the main gate electrode 9 with respect to the channel region 7. The light-shielding layer 11 consists of the aforementioned light-shielding thin film. When the light-shielding thin film is electrically conductive, the light-shielding layer 11 also works as a sub-gate electrode that controls back channels.

The pair of main and sub-gate electrodes 9 and 11 arranged on both sides of the channel region 7 are made of light-shielding material and hence, completely shut off the light incident on the channel region 7.

In this embodiment, furthermore, the channel region 7 is formed of a semiconducting thin film of a single silicon crystal to which ordinary LSI processing technologies can be directly adapted. Therefore, the channel length can be shortened to the order of submicrons.

Figure 2:
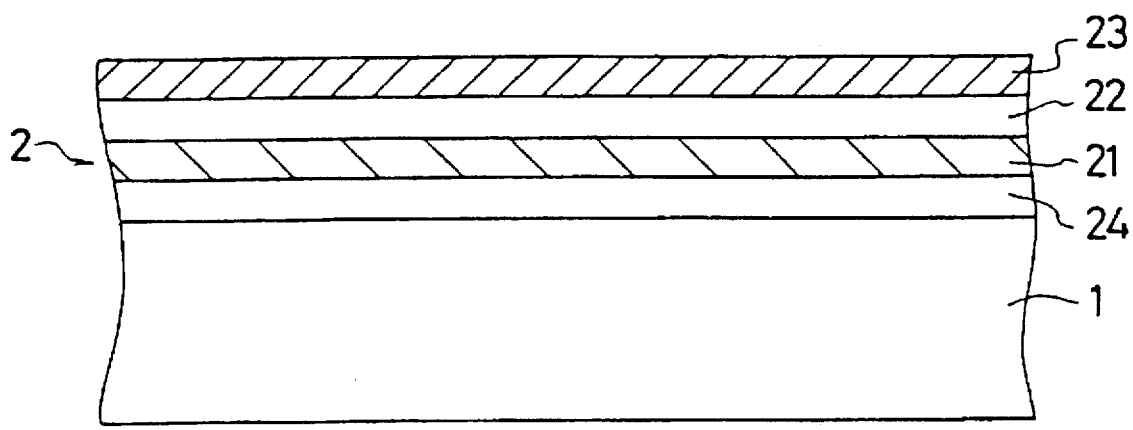
FIG. 2 is a partial sectional view which schematically illustrates the structure of a composite substrate used for fabricating the above semiconductor device.

FIG. 2 is a schematic partial sectional view of a composite substrate used for fabricating a semiconductor device for driving light valves of a flat plate-type according to the present invention. The composite substrate consists of the support substrate 1 and the stacked-layer structure 2 formed thereon as shown. First, the support substrate 1 is composed of a light-transmitting insulating material such as a heat-resistant quartz consisting chiefly of silicon oxide or aluminum oxide. Aluminum oxide exhibits a coefficient of thermal expansion which is close to that of silicon and gives advantage in regard to suppressing stress. Furthermore, since single crystals of aluminum oxide can be formed, it is possible to heteroepitaxially grow a single crystalline semiconductor film thereon. Next, the laminated layer structure 2 has a light-shielding thin film 21 arranged on the support substrate 1, an insulating film 22 arranged on the above light-shielding thin film 21, and a semiconducting thin film 23 that is arranged on the insulating film 22 and is composed of a single crystalline material adhered to the support substrate 1. The light-shielding thin film 21 is composed of an electrically conductive materials, such as polysilicon. Alternatively, it is also possible to use a single layer film of germanium, silicon-germanium or silicon, or a multi-layer film of silicon including at least one layer of germanium or silicon-germanium instead of the single layer film of polysilicon. It is further possible to use a metal film such as of silicide or aluminum instead of the above semiconductor materials. When aluminum oxide, i.e., sapphire, is used as the support substrate, furthermore, a single silicon crystal can be heteroepitaxially grown thereon to form a light-shielding film.

The stacked-layer structure 2 may include a ground film 24 that is interposed between the support substrate 1 and the light-shielding thin film 21. The ground film 24 is provided to improve the adhesion between the support substrate 1 and the stacked-layer structure 2. For instance, when the support substrate 1 is of quartz that consists mainly of silicon oxide, there can be used silicon oxide as the ground film 24. When it is desirable for the ground film 24 to block the infiltration of impurities from the support substrate 1, the ground film should be composed of a layer of silicon nitride or oxynitride, or a multilayer film of at least either one of them and silicon oxide. In particular, the oxynitride is useful since it is capable of adjusting the stress.

Next, the insulating film 22 is used as a gate insulating film for the sub-gate electrode which consists of the light-shielding thin film 21, and is composed of, for instance, silicon oxide or silicon nitride. Or, the insulating film 22 may be constituted by a multi-layer film of silicon nitride and silicon oxide.

The semiconducting thin film 23 positioned at the top of the stacked-layer structure 2 is made, for example, of silicon. This silicon may be of a single crystalline form, polycrystalline form or amorphous form. The amorphous silicon thin film or the polycrystalline silicon thin film can be easily deposited on a glass substrate by chemical vapor deposition, and is adaptable to manufacture of an active matrix device having a relatively large screen. When such an amorphous silicon thin film is used, it is possible to make a active matrix liquid crystal device having a screen size of about three inches to ten inches. In particular, the amorphous silicon thin film can be formed at a temperature as low as 350° C. or less, and is suitable for liquid crystal panels of large areas. When a polycrystalline silicon thin film is used, it is allowed to make small liquid crystal panels of about two inches.

In the case of using a polycrystalline silicon thin film, however, the reproducibility of element constant is poor and variations increase when a transistor is formed having a channel length on the order of submicrons by adopting fine semiconductor processing technology. When amorphous silicon is used, furthermore, a high-speed switching cannot be realized even though the submicron processing technology is employed. When a semiconducting thin film of a single crystal of silicon is used, on the other hand, it is possible to directly adopt fine semiconductor processing technology to greatly increase the density of the switching elements and to obtain an ultra-fine light valve device.

Even though the switching element has a channel length on the order of microns, a high channel mobility makes it possible to realize a high-speed operation. It is further possible to integrate peripheral circuits for controlling the switching elements on the same support substrate in a large scale and to control the array of switching elements at high speeds, so that the light valve device manufactured by use of semiconductor thin film of silicon single crystal is indispensable for displaying highly fine moving pictures.

Described below in detail with reference to FIG. 3 is a method of fabricating a semiconductor device according to the present invention. First, a composite substrate is prepared in a process shown in FIG. 3(A). That is, the ground film 24 of silicon oxide is formed on the support substrate 1 of a polished quartz plate by a chemical vapor deposition method or sputtering. The light-shielding thin film 21 made of polysilicon is deposited on the ground film 24 by a chemical vapor deposition method. Then, the insulating film 22 made of silicon oxide is formed on the light-shielding thin film 21 by a thermal oxidation method or chemical vapor deposition method. Lastly, the semiconductor thin film 23 of a single silicon crystal is formed on the insulating film 22. The semiconductor thin film 23 is obtained by adhering the semiconducting substrate of a single silicon crystal to the insulating film 22 and then polishing it until its thickness becomes several μm. The single crystalline silicon semiconductor substrate to be used is preferably a silicon wafer of high quality that is used for manufacturing LSIs having uniform crystal orientation within a range of [100] 0.0±1.0 and a single crystal lattice defect density of smaller than 500 defects/cm². The surface of the silicon wafer having such physical properties is, first, finished precisely and smoothly. Then the smoothly finished surface is superposed on the insulating film 22 followed by heating to adhere the silicon wafer to the support substrate 1 by thermocompression bonding. By thermocompression bonding, the silicon wafer and the support substrate 1 are firmly adhered to each other. In this state, the silicon wafer is polished until a desired thickness is obtained. Here, it is possible to carry out an etching instead of the polishing. The thus obtained single crystalline silicon semiconductor thin film 23 substantially keeps the quality of the silicon wafer; therefore a semiconductor substrate material is obtained having very excellent uniformity in the crystal orientation and a low lattice defect density.

By current technologies, the surface of the silicon wafer that is adhered by thermocompression bonding has electrical defects to some extent, and the following process is further preferable. SiO$_2$ is formed in the single crystalline wafer by thermal oxydation or CVD. Then, polysilicon is formed by CVD and the surface is polished as required. Thereafter, SiO$_2$ is formed by thermal oxidation or CVD, silicon nitride film is formed by CVD and SiO$_2$ is formed by thermal oxidation or CVD in the order mentioned. The silicon wafer is adhered by thermocompression bonding onto a quartz support substrate or a quartz support substrate coated with SiO$_2$ by CVD and is, then, polished.

Figure 3A:
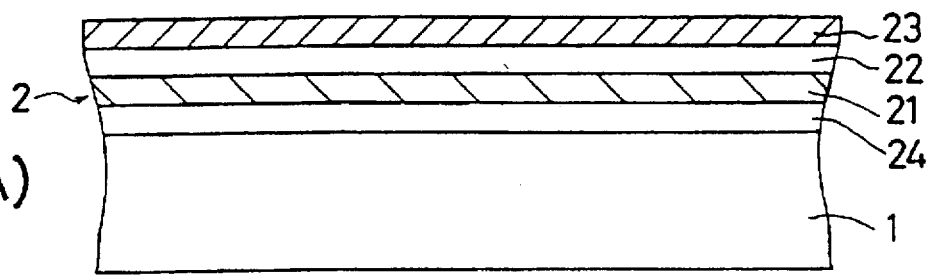
FIGS. 3(A)–3(H) and 4(A)–4(J) are schematic diagrams illustrating different steps for fabricating the flat-type semiconductor device for driving light valves.
Figure 3B:
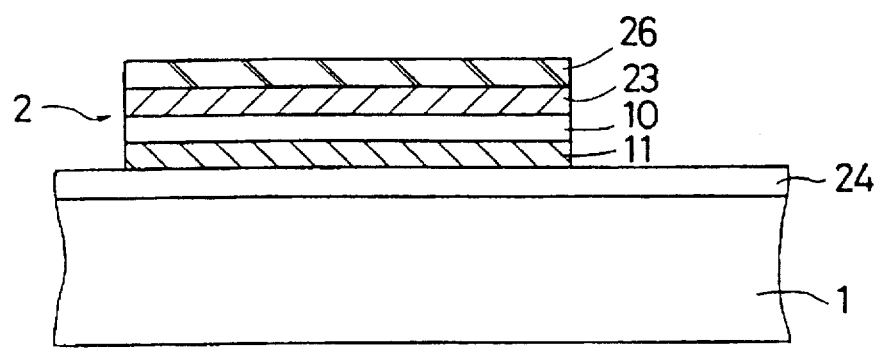

Next, in a step shown in FIG. 3(B), the stacked-layer structure 2 is etched in order except the ground film 24 in order to form the light-shielding layer 11 of the light-shielding thin film 21 on the undermost layer, namely, the ground film 24. At the same time, the gate oxide film 10 of an insulating film 22 is formed on the light-shielding layer 11. The light-shielding layer 11 is formed by applying a photosensitive film 26 onto the whole surface of the composite substrate followed by patterning into a desired shape and, then, effecting an etching selectively using the patterned photosensitive film 26 as a mask.

Figure 3C:
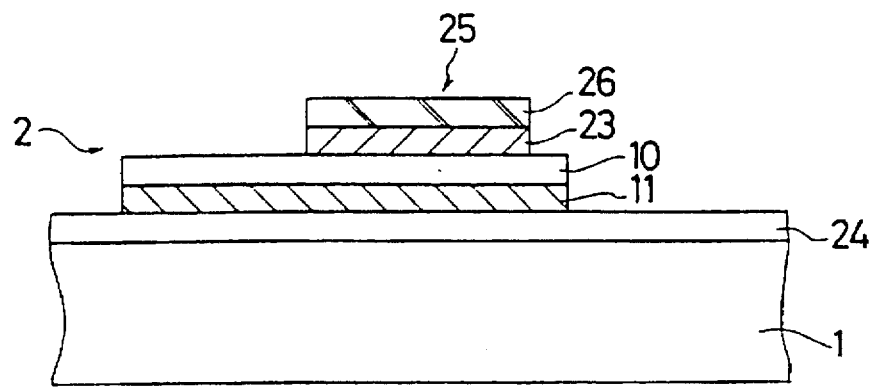

Then, in a step shown in FIG. 3(C), an element region 25 is formed on the two-layer structure consisting of the patterned light-shielding layer 11 and the gate oxide film 10. The element region 25 is obtained by selectively etching only the semiconducting thin film 23 into a desired shape.

The semiconducting thin film 23 is selectively etched by using, as a mask, the photosensitive film 26 that is patterned to the shape of the element region.

Figure 3D:
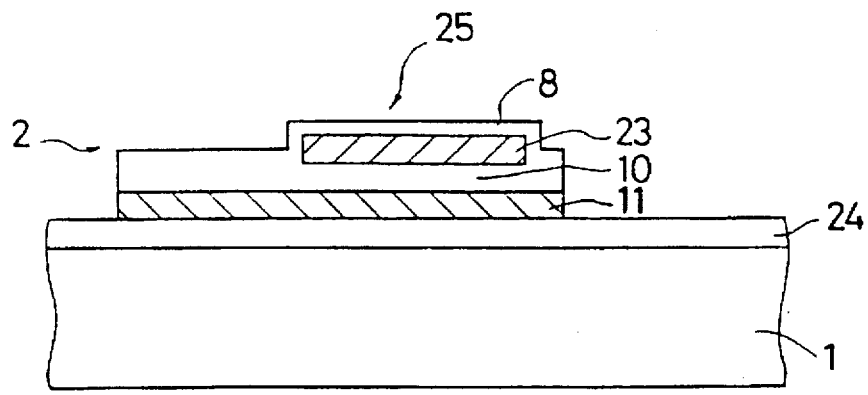

In a step shown in FIG. 3(D), furthermore, the photosensitive film 26 is removed and, then, a thermally oxidized film is formed on the whole surface inclusive of the surface of the semiconductive thin film 23 that is exposed. As a result, a gate oxide film 8 is formed on the surface of the semiconducting thin film 23.

Figure 3E:
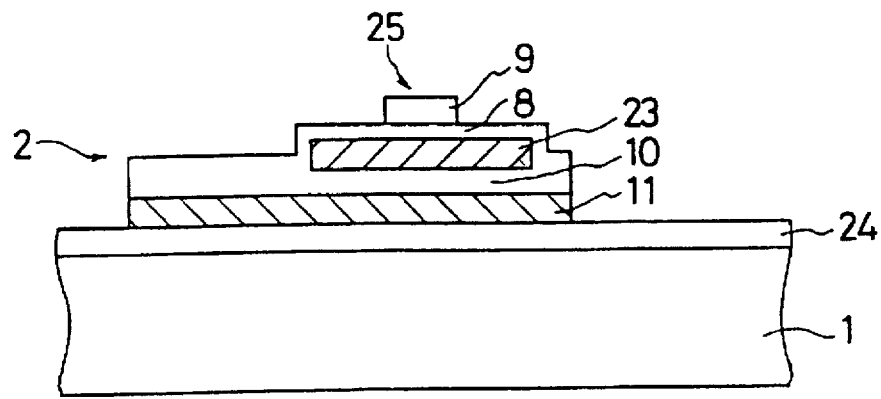

Then, in a step shown in FIG. 3(E), a polycrystalline silicon film is deposited by a chemical vapor deposition method to cover the element region 25. The polycrystalline silicon film is selectively etched using a photosensitive film (not shown) that is patterned into a desired shape in order to form the main gate electrode 9. The main gate electrode 9 is positioned above the semiconducting thin film 23 via the gate oxide film 8.

Figure 3F:
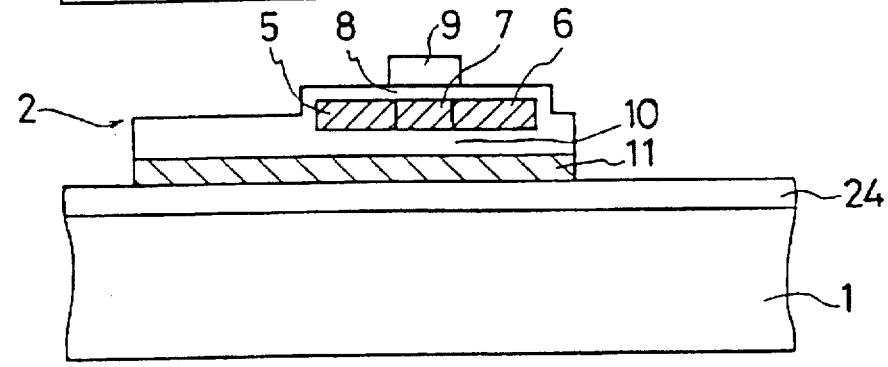

In a step shown in FIG. 3(F), impurity ions are injected through the gate oxide film 8 using the main gate electrode 9 as a mask in order to form the drain region 5 and the source region 6 in the semiconducting thin film 23. As a result, there is formed a transistor channel region 7 that contains no impurity under the main gate electrode 9 between the drain region 5 and the source region 6.

Figure 3G:
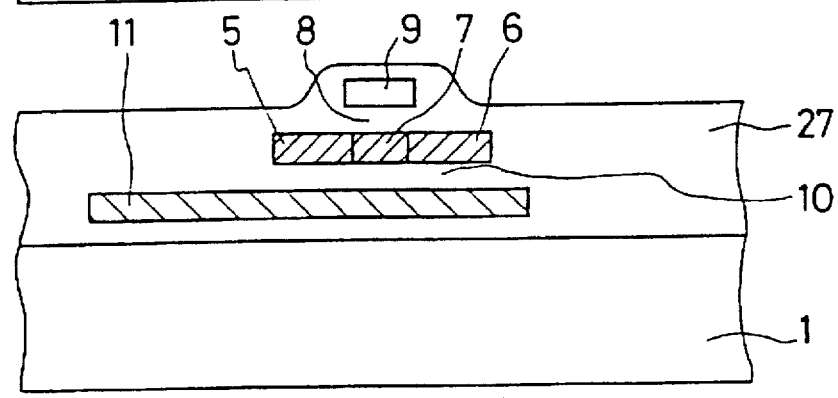

Next, in a step shown in FIG. 3(G), a protective film 27 is formed to cover the element region. As a result, the switching element that includes the light-shielding layer 11 and the main gate electrode 9 is buried under the protective film 27.

Figure 3H:
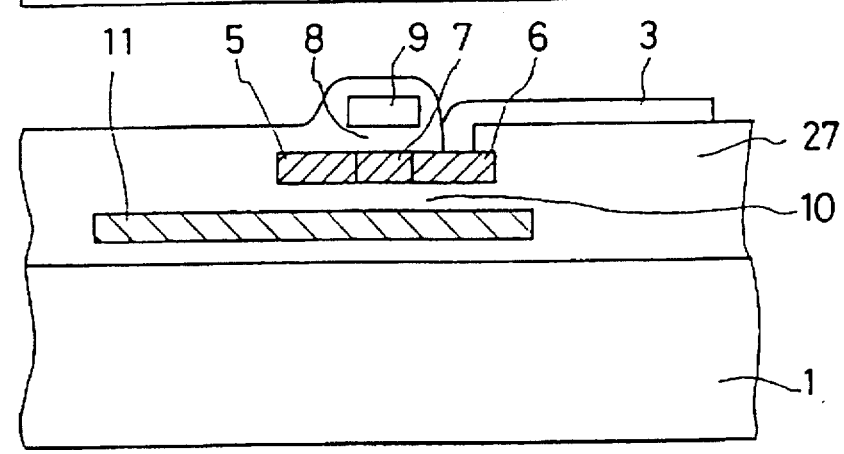

Lastly, in a step shown in FIG. 3(H), the gate oxide film 8 on the source region 6 is partly removed to form a contact hole, and a transparent pixel electrode 3 is so formed as to cover this portion. The pixel electrode 3 is made of a transparent material such as ITO. In addition, the protective film 27 provided on the lower side of the pixel electrode 3' is made, for example, of silicon oxide and is transparent. Moreover, the support substrate 1 of quartz glass on the lower side thereof is transparent, too. Therefore, the three-layer structure consisting of the pixel electrode 3, protective film 27 and quartz glass support substrate 1, is optically transparent and can be utilized for a light valve device of a transmission type.

The pair of main gate and sub-gate electrodes 9 and 11 that vertically sandwich the channel region 7 are made of polysilicon which is optically opaque in contrast to the above three-layer structure, and shut off the entering light and prevent leakage current from flowing into the channel region. The incident light can be perfectly shut off by using a material having a low band gap such as silicon, germanium or the like.

In the manufacturing method shown in FIG. 3 as described above, the semiconductor thin film 23 of high-quality single crystalline silicon is processed at a temperature higher than 600° C., followed by photolithoetching technique with high resolution and by a ion implantation, making it possible to form a field-effect insulated gate transistor having a size of the order of microns or submicrons. The single crystalline silicon film of a very high quality is used, and, hence, the obtained insulated gate transistor exhibits excellent electric characteristics. At the same time, the pixel electrode 3 can be formed in a size of the order of microns by a the minituarization technology, making it possible to fabricate a semiconductor device for active matrix liquid crystal having a high density and fine structure.

Figure 4A:
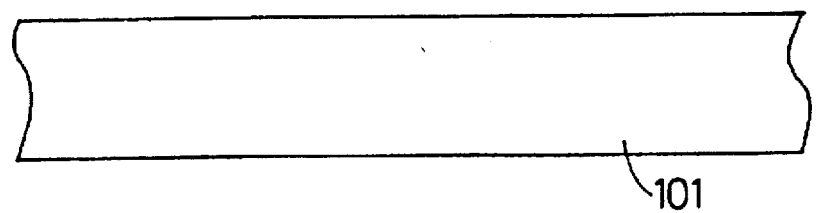
Figure 4B:
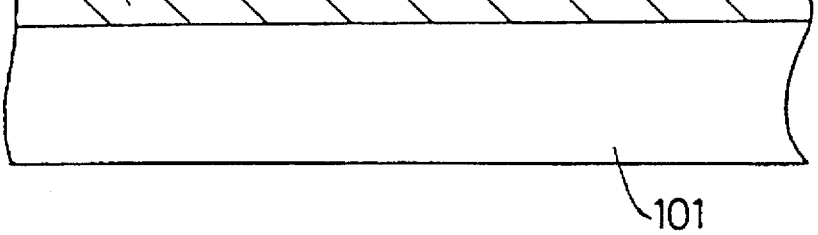
Figure 4C:
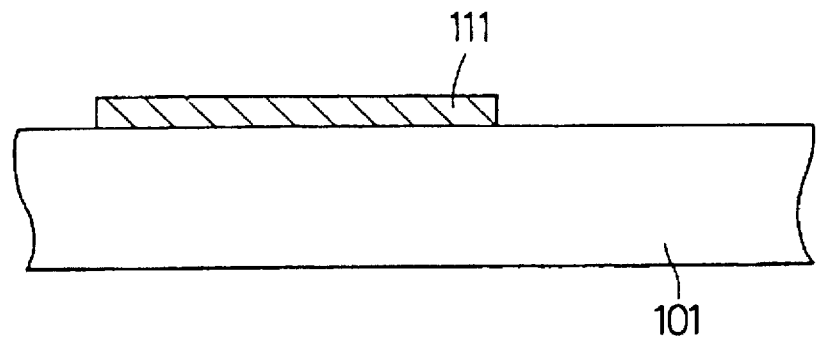
Figure 4D:
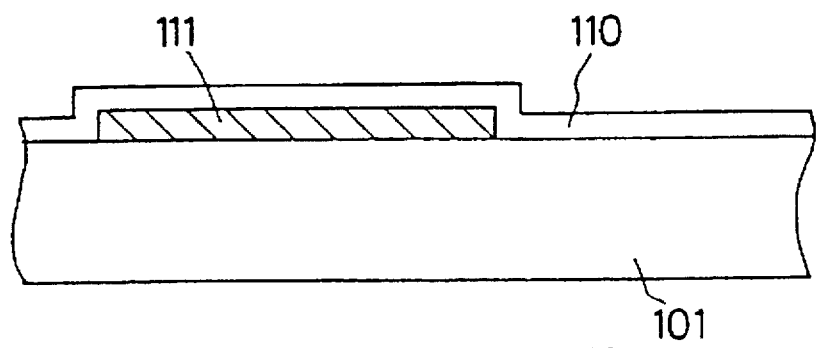
Figure 4E:
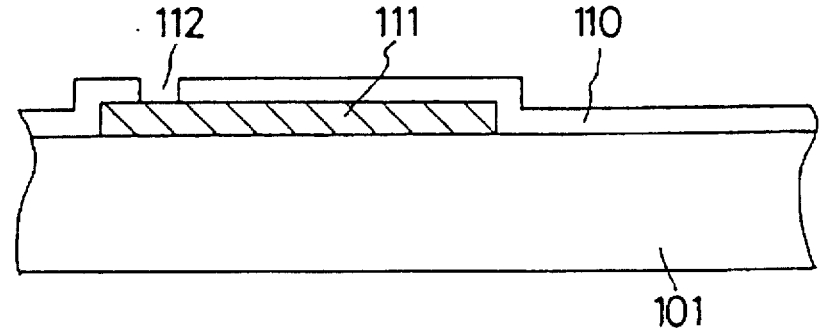
Figure 4F:
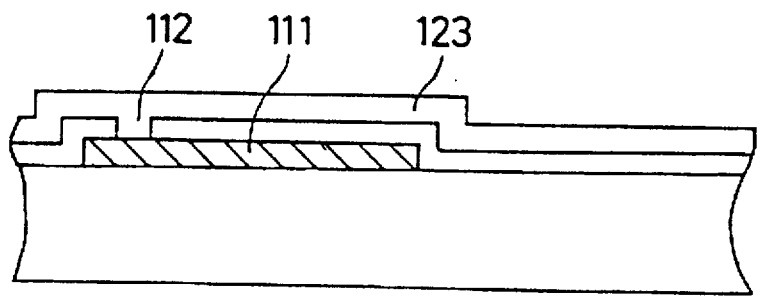
Figure 4G:
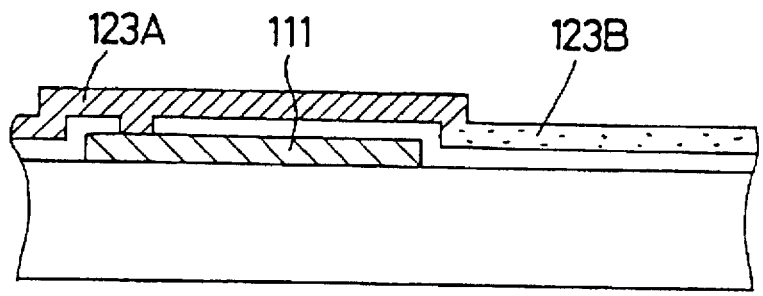
Figure 4H:
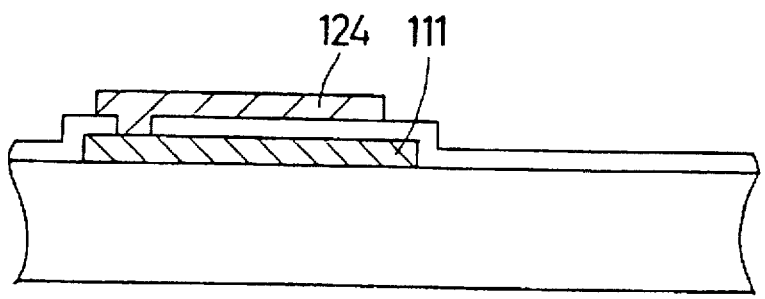
Figure 4I:
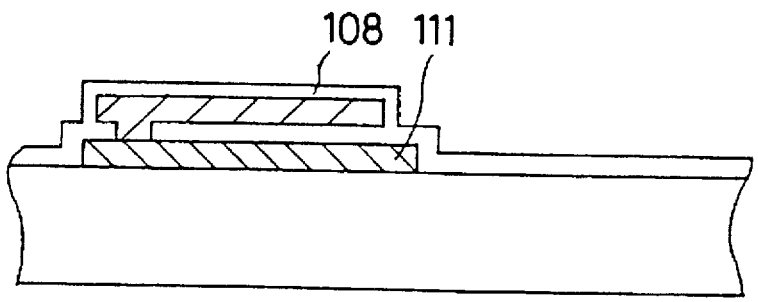
Figure 4J:
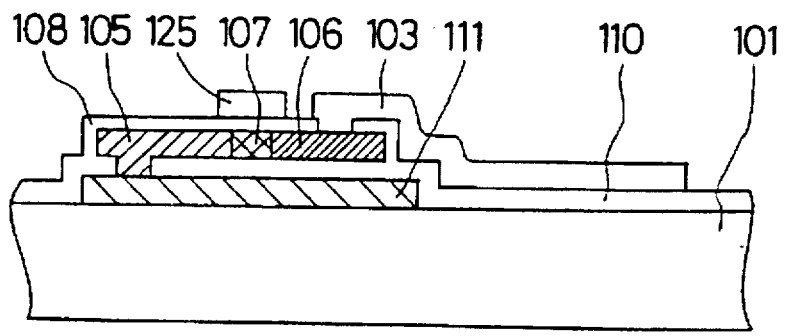

FIG. 3 shows the embodiment in which the single crystalline semiconductor film 23 is formed by thermocompression bonding. Referring to FIG. 4, another embodiment is shown where the single crystalline semiconductor film is formed by an epitaxial method instead of the thermocompression bonding. First, a transparent aluminum oxide 101 such as sapphire is used as the support substrate as shown in FIG. 4(A). Next, as shown in FIG. 4(B), a single crystalline silicon film 102 is heteroepitaxially grown using the crystal of aluminum oxide 101 as a seed. In the polycrystalline form, aluminum oxide has a coefficient of thermal expansion that is closer to that of silicon than that of quartz. When polycrystalline aluminum oxide is used as the support substrate of the embodiment shown in FIG. 3, the thermal stress is small and the crystallinity of the single crystalline silicon film formed thereon can be maintained even after the semiconductor processing at a high temperature. In FIG. 4 showing a process where single crystalline aluminum oxide is used, it is possible to hetero-epitaxially grow the single crystalline silicon film 102 as shown in FIG. 4(B). Next, the single crystalline silicon film 102 that is grown is patterned as in FIG. 4(C) to form a light-shielding film 111. Then, an insulating film 110 is formed as shown in FIG. 4(D), a hole 112 is made in a portion thereof, so that the surface of the single crystalline silicon film 111 is partially exposed as shown in FIG. 4(E). Next, an amorphous or polycrystalline semiconductor film 123 is formed as shown in FIG. 4(F). The single crystalline silicon film 111 and the semiconductor film 123 are in contact with each other in the hole 112. If the heat treatment is carried out in this state at a high temperature, the semiconductor film 123 grows laterally and epitaxially with the single crystalline silicon film 111 in the hole as a seed. As shown in FIG. 4(G), therefore, the region 123A close to the hole is transformed into a single crystal. The region 123B that is not transformed into a single crystal is kept in a polycrystalline form. Though FIG. 4(F) illustrates an example in which the polycrystalline semiconductor film 123 is, first, formed and is then grown laterally and epitaxially by a heat treatment, it should be noted that the single crystalline semiconductor film can also be formed, as shown in FIG. 4(G), even by gas-source epitaxy or liquid-phase epitaxy from the state shown in FIG. 4(E). Use can be made of a silicon film or a GaAs film as a semiconducting film. Next, as shown in FIG. 4(H), a region 124 that serves as the substrate of a transistor is patterned. Next, as shown in FIG. 4(I), a gate insulating film 108 is formed and, finally, a transistor is formed in which a transparent electrode 103 is connected with a drain region 106 as shown in FIG. 4(J). The conductance of a channel region 107 between the source region 105 and the drain region 106 is controlled through the gate electrode 125 and the light-shielding film 111. FIG. 4(J) illustrates an example in which the light-shielding film 111 is connected to the source region 105 which, however, is not necessary. In FIG. 4(G), the single crystalline region is grown laterally and epitaxially so long as 3 to 5 μm, enabling a single crystalline transistor to be formed on the insulating film as shown in FIG. 4(J).

Figure 5:
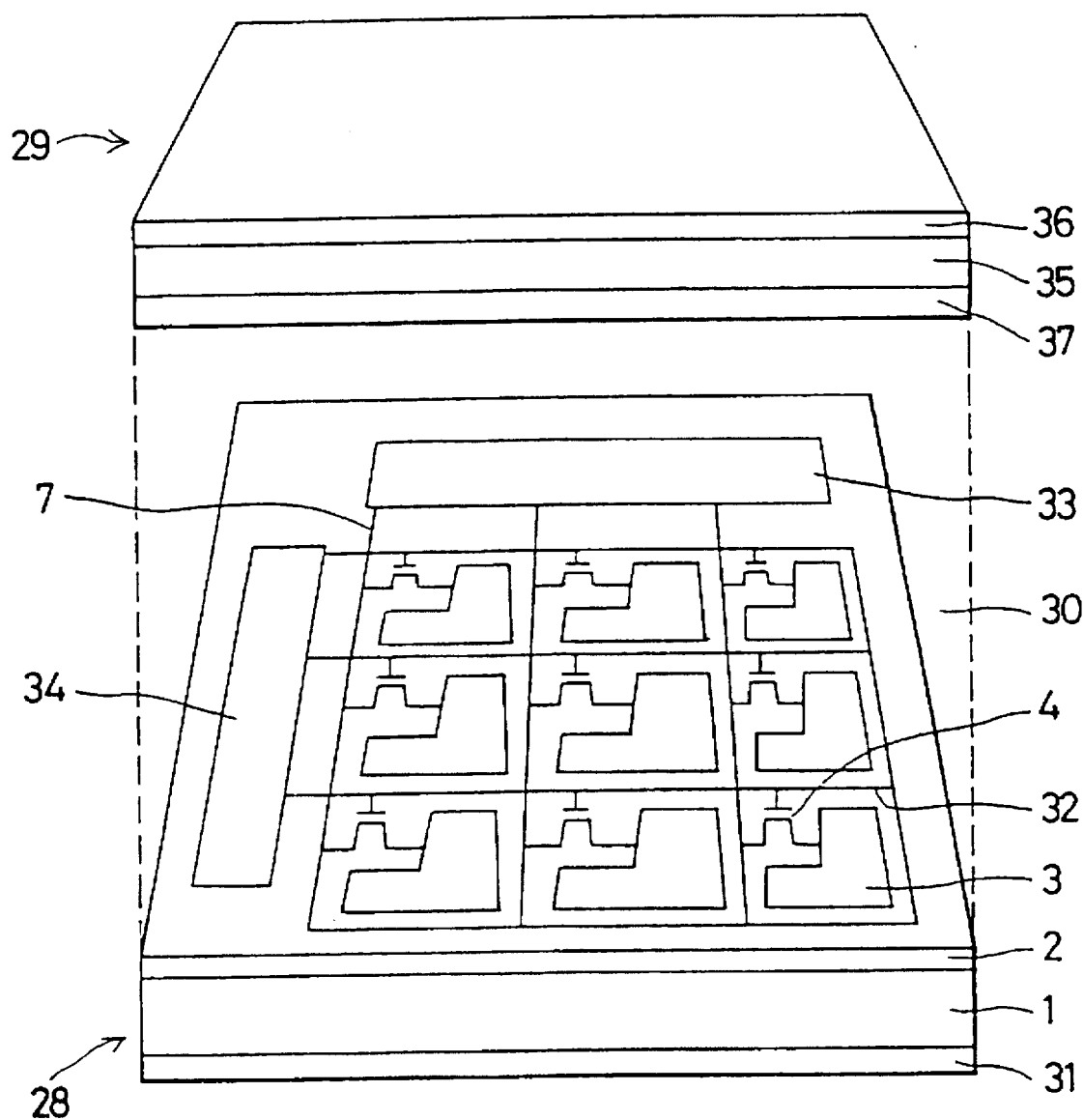
FIG. 5 is a perspective exploded view which schematically illustrates the structure of the light valve device of a flat plate-type constituted by using the semiconductor device of the invention.

Lastly, described below with reference to FIG. 5 is an optical valve device that is assembled by using the semiconductor device of the present invention. As shown, the light valve device is constituted by a semiconductor device 28, a facing substrate 29 facing the semiconductor device 28, and an electrooptical material layer such as a liquid crystal layer 30 between the semiconductor device 28 and the facing substrate 29. In the semiconductor device 28 are formed pixel electrodes or drive electrodes 3 that define pixels and switching elements 4 for exciting the drive electrodes 3 in response to predetermined signals.

The semiconductor device 28 consists of the support substrate 1 composed of quartz glass and the laminated layer structure 2 formed on the support substrate 1. In addition, a polarizer plate 31 is adhered to the back surface of the support substrate 1. The switching elements 4 are formed in a single crystalline silicon semiconductor thin film included in the stacked-layer structure 2. The switching elements 4 are constituted by a plurality of field-effect insulated gate transistors arranged in a matrix. The source region of each transistor is connected to a corresponding pixel electrode 3, the main gate electrode is connected to the scanning line 32, and the drain electrode is connected to the signal line 7.

The semiconductor device 28 further includes an X-driver 33 connected to the signal lines 7 arranged in columns, and includes a Y-driver 34 connected to the scanning lines 32 arranged in rows. The facing substrate 29 is constituted by a glass substrate 35, a polarizing plate 36 adhered to the outer surface of the glass substrate 35, and a facing electrode or a common electrode 37 formed on the inner surface of the glass substrate 35.

Though not diagramed, the light-shielding layer or the sub-gate electrode included in each switching element 4 is preferably connected to the scanning line 32 together with the main gate electrode. The above connection makes it possible to effectively prevent leakage current from flowing into the channel region of the transistor that constitutes the switching element. Or, the light-shielding layer can be connected to the source region or the drain region of the corresponding transistor. In any way, a predetermined voltage is applied to the light-shielding layer to effectively prevent leakage current from flowing due to the back channel. By controlling the voltage applied to the light-shielding layer, furthermore, the threshold voltage of the channel region can be set to a desired value.

Operation of the thus constituted light valve device will now be described in detail with reference to FIG. 5. The main gate and sub-gate electrodes of each switching element 4 are connected in common to the scanning line 32, and are supplied with scanning signals from the Y-driver 34; therefore the turn-on/off of the switching elements 4 is controlled line by line. A data signal output from the X-driver 33 is applied, via signal line 7, to a selected switching element 4 that has been turned on. The applied data signal is transmitted to the corresponding pixel electrode 3 to excite it and acts upon the liquid crystal layer 30, so that its transmission factor becomes substantially 100%. When not selected, on the other hand, the switching element 4 is left nonconductive and maintains the data signal previously written on the pixel electrode as electric charge. Here, the liquid crystal layer 30 has a large resistivity and usually operates a capacitive element.

An on/off current ratio is used to represent the switching performance of the switching elements 4. The current ratio necessary for operating the liquid crystal can be easily found from the write time and the holding time. For instance, when the data signal is a television signal, more than 90% of the data signal must be written within about 60 μsec of one scanning period. On the other hand, more than 90% of the electric charge must be retained for a period of one field which is about 16 msec. Therefore, the current ratio must be at least on the order of ten thousand. In this respect according to the present invention, the conductance of the channel region is controlled from both surfaces thereof by the main gate and sub-gate electrodes, and the leakage current is substantially perfectly eliminated during the off period. The on/off ratio of the switching elements having such a structure is on the order of a hundred thousand or greater. It is therefore possible to obtain a light valve device of an active matrix type having a very fast signal response characteristic.

According to the present invention as described above, a pair of main gate and sub-gate electrodes arranged on both sides of the transistor channel region are formed using a light-shielding material such as polysilicon, and whereby the light entering the channel region from outside is effectively shut off, making it possible to effectively prevent the occurrence of leakage current by the photo-electric effect. Moreover, since the transistor channel region formed in the semiconductor thin film is controlled from the upper and lower sides thereof by the main gate electrode and by the light-shielding layer, i.e., the sub-gate electrode composed of an electrically conductive material, the so-called back channel is effectively prevented, and a thin-film transistor having a very excellent on/off ratio is obtained. As a result, there can be obtained a semiconductor device for driving light valves of a flat plate-type featured by very high response characteristics and free from erroneous operation. In addition, by forming the switching elements consisting of field-effect insulated gate transistors in the semiconducting thin film of single crystalline silicon, it is possible to obtain a flat-type semiconductor device for driving light valves that has a very fine and very large scale integration structure.

What is claimed is:

1. A method of fabricating a semiconductor device, comprising the steps of: forming a substrate having a stacked-layered structure comprised of a support substrate, a light-shielding layer formed on the support substrate, an insulating layer formed on the light-shielding layer, and a semiconductor layer formed on the insulating layer; selectively etching the light-shielding layer to form a light-shielding layer pattern; and thereafter forming a transistor switching element having a channel region formed in and constituting part of the semiconductor layer and having a main gate electrode formed over and being electrically insulated from the channel region, wherein the step of forming a substrate includes performing thermocompression bonding of the semiconductor layer to the insulating layer.

2. A method according to claim 1; wherein the insulating layer is formed of silicon oxide and the semiconductor layer is formed of single crystal silicon.

3. A method of fabricating a semiconductor device, comprising the steps of: forming a substrate having a stacked-layered structure comprised of a support substrate, a light-shielding layer formed on the support substrate, an insulating layer formed on the light-shielding layer, and a semiconductor layer formed on the insulating layer; selectively etching the light-shielding layer to form a light-shielding layer pattern; and thereafter forming a transistor switching element having a channel region formed in and constituting part of the semiconductor layer and having a main gate electrode formed over and being electrically insulated from the channel region, wherein the step of forming a substrate includes adhering a semiconductor material to the insulating layer, and polishing the semiconductor material to form the semiconductor layer.

4. A method according to claim 3; wherein the polishing is carried out to form the semiconductor layer to a thickness of several microns.

5. A method of fabricating a semiconductor device, comprising the steps of: forming a substrate having a stacked-layered structure comprised of a transparent support substrate, a light shielding layer formed on the support substrate, an insulating layer formed on the light-shielding layer, and a semiconductor single crystal layer formed on the insulating layer; selectively etching the light-shielding layer to form a light shielding layer pattern by forming a photosensitive film on the semiconductor single crystal layer, patterning the photosensitive film to the shape of the pattern of the light-shielding layer, and selectively etching the stacked-layered structure using the patterned photosensitive film as a mask; and thereafter forming a transistor switching element having a channel region formed in and constituting part of the semiconductor single crystal layer and having a main gate electrode formed over and being electrically insulated from the channel region; wherein the channel region is provided over the light shielding layer pattern to prevent light incident from the transparent support substrate from illuminating the channel region to suppress a photo-induced current in the channel region.

6. A method according to claim 5; wherein the step of forming a transistor switching element includes selectively etching the semiconductor single crystal layer using the patterned photosensitive film as a mask to form the part of the semiconductor layer in which is formed the channel region of the transistor switching element.

7. A method of fabricating a semiconductor device, comprising the steps of: preparing a support substrate; bonding a semiconductor single crystal wafer to the support substrate; thinning the semiconductor single crystal wafer to a semiconductor single crystal thin film; and forming a transistor element having a channel region formed in the semiconductor single crystal thin film and having a gate electrode formed over and electrically insulated from the channel region, wherein the support substrate is a transparent support substrate, the step of preparing the transparent support substrate includes forming a light-shielding layer on the transparent support substrate, and the step of forming the transistor element includes forming the channel region over the light-shielding layer.

8. A method of fabricating a semiconductor device, comprising the steps of: forming a substrate having a stacked-layered structure comprised of a transparent support substrate, a light shielding layer formed on the support substrate, an insulating layer formed on the light-shielding layer, and a semiconductor single crystal layer formed on the insulating layer, wherein the semiconductor single crystal layer is thermally bonded to the insulating layer by thermocompression bonding; selectively etching the light-shielding layer to form a light shielding layer pattern; and thereafter forming a transistor switching element having a channel region formed in and constituting part of the semiconductor single crystal layer and having a main gate electrode formed over and being electrically insulated from the channel region; wherein the channel region is provided over the light shielding layer pattern to prevent light incident from the transparent support substrate from illuminating the channel region to suppress a photo-induced current in the channel region.

9. A method of fabricating a semiconductor device, comprising the steps of: forming a substrate having a stacked-layered structure comprised of a transparent support substrate, a light shielding layer formed on the support substrate, an insulating layer formed on the light-shielding layer, and a semiconductor single crystal layer formed on the insulating layer, wherein the step of forming the semiconductor single crystal layer includes the steps of adhering a semiconductor single crystal wafer to the insulating layer and thinning the wafer; selectively etching the light-shielding layer to form a light shielding layer pattern; and thereafter forming a transistor switching element having a channel region formed in and constituting part of the semiconductor single crystal layer and having a main gate electrode formed over and being electrically insulated from the channel region; wherein the channel region is provided over the light shielding layer pattern to prevent light incident from the transparent support substrate from illuminating the channel region to suppress a photo-induced current in the channel region.

10. A method according to claim 9; wherein the step of adhering the wafer to the insulating layer includes the step of thermally bonding the wafer to the insulating layer.

* * * * *